United States Patent [19]

Suppelsa

[11] Patent Number: 5,573,859
[45] Date of Patent: Nov. 12, 1996

[54] AUTO-REGULATING SOLDER COMPOSITION

[75] Inventor: Anthony B. Suppelsa, Coral Springs, Fla.

[73] Assignee: Motorola, Inc., Schaumburg, Ill.

[21] Appl. No.: 523,449

[22] Filed: Sep. 5, 1995

[51] Int. Cl.$^6$ ...................................................... B22F 7/04
[52] U.S. Cl. ............................ 428/553; 428/548; 428/563
[58] Field of Search .................................... 428/548, 553, 428/56.3

[56] References Cited

U.S. PATENT DOCUMENTS

| | | | |
|---|---|---|---|
| 4,097,266 | 6/1978 | Takshaski et al. | 75/0.5 R |
| 5,093,545 | 3/1992 | McGaffigan | 219/9.5 |

*Primary Examiner*—Ngoclan Mai
*Assistant Examiner*—Anthony R. Chi
*Attorney, Agent, or Firm*—Dale W. Dorinski

[57] ABSTRACT

A soldering composition is self melting and is auto-regulating. The solder composition (100) has a central core (102) made from a non-magnetic metal. A coating (105) of a magnetic material surrounds most or all of the central core. A solder layer (108) overlies the coating of magnetic material, and the solder layer has a melting temperature that is lower than the Curie temperature of the magnetic material. The auto-regulating temperature substantially corresponds to the Curie temperature. When the solder composition is placed in a field of alternating current, the magnetic material heats up and melts the solder coating. When the Curie temperature is reached, the magnetic material stops heating, thus controlling the maximum temperature of the soldering composition. As the temperature of the composition drops below the Curie temperature, the magnetic material again heats up, thus keeping the temperature of the solder constant.

15 Claims, 1 Drawing Sheet

5,573,859

AUTO-REGULATING SOLDER COMPOSITION

CROSS REFERENCE TO RELATED APPLICATIONS

This application is related to a U.S. patent application filed concurrently herewith, as Ser. No. 08/523,454 by Anthony B. Suppelsa and Dale W. Dorinski, entitled "Ball Grid Array Package with Auto-Regulating Solder Composition," and assigned to Motorola, Inc.

TECHNICAL FIELD

This invention relates in general to a soldering composition, and more particularly to an auto-regulating solder and solder paste.

BACKGROUND

The majority of electronic circuitry assembled today utilizes surface mounted components, soldered onto the surface of printed circuit boards. The solder is applied to the printed circuit boards by screen printing or stencil printing solder paste onto the desired locations, placing the surface mount components into the solder paste, and subsequently thermally fusing the solder paste with an oven, infrared heater or convection heater.

The conventional state-of-the-art solder paste consists of small particles of solder suspended in a screening vehicle that contains volatile solvents and flux. The requirements and specifications governing solder pastes and soldering flux for electronics use are cited in the American National Standards J-STD-004, and J-STD-005, jointly issued in January 1995 by the Electronic Industries Association (EIA), 2001 Pennsylvania Ave., NW., Washington D.C. 20006 and the Institute for Interconnecting and Packaging Electronic Circuits (IPC), 7380 N. Lincoln Ave, Lincolnwood, Ill. 60646. The specifications and requirements for the solder alloy compositions and solder powders used in electronic grade solder pastes are cited in American National Standard J-STD-006. The solder composition in the spherical powders used to make up solder pastes is usually of a homogeneous pre-fused alloy composition specific to the desired melting point of the solder and its final intended use or application. Solder powders and solder pastes of various melting points and alloy compositions are readily available from a number of foundry sources, including: Alpha Metals, Jersey City, N.J. 07304; Advanced Metals Technology Inc., Branford, Conn. 06405; or Indium Corporation of America, Utica, N.Y. 13502.

The known art also contains the technology to coat copper and silver particles with low melting solders (U.S. Pat. No. 4,097,266, incorporated herein by reference), and the use of such coated copper spheres in solder paste as standoffs for components on electronic circuits (U.S. Pat. No. 4,731,130 incorporated herein by reference). All of these solder powders and solder pastes are fused in their final use application by heating with an external heating source, such as an oven or soldering iron. One problem with this technology is that sophisticated ovens are now required to closely control the temperature of the soldering operation in order to create the precisely structured miniature solder joints commonly found in today's electronic assemblies. The soldering process has become very demanding and often cannot be properly performed because some components mask the heat source from the solder joint, thus causing poor reflow of the solder. In other cases, the large mass of the part relative to the amount of solder causes unequal heating of the solder, again resulting in a poor solder joint. What is needed is a solder powder, solder paste, or soldering system that does not need direct physical contact with thermal heat sources such as ovens or solder irons to effect fusion or melting of the solder.

DETAILED DESCRIPTION OF THE PREFERRED EMBODIMENT

Figure 1:
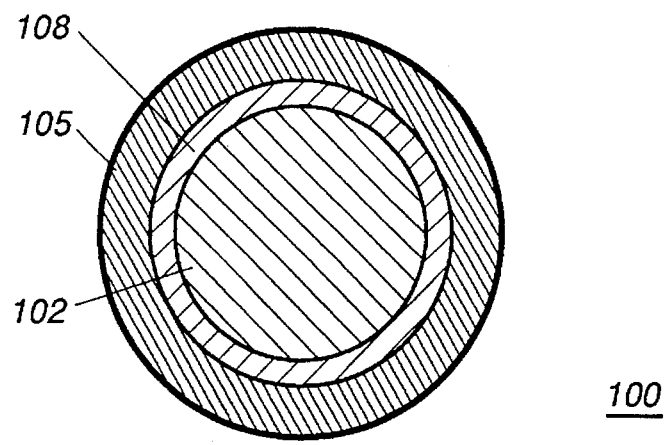
FIG. 1 is a cross-sectional view of a self heating, auto-regulating solder particle of the present invention.

A novel soldering composition is self melting and auto-regulating. The solder composition has a central core made from a non-magnetic metal. A coating of a magnetic material surrounds most or all of the central core. A solder layer overlies the coating of magnetic material, and the solder layer has a melting temperature that is lower than the Curie temperature of the magnetic material. The auto-regulating temperature substantially corresponds to the Curie temperature. When the solder composition is placed in a field of alternating current, the magnetic material heats up and melts the solder coating until the Curie temperature is reached. At this point, the magnetic material stops heating, thus controlling the maximum temperature of the soldering composition. As the temperature of the composition drops below the Curie temperature, the magnetic material again heats up, keeping the temperature of the solder constant. The solder is melted and fused without the need for precise regulation of the external heat source. The solder composition is auto-regulating and limits the maximum temperature, thus is precisely controllable. A solder paste can be formulated with this solder composition.

While the specification concludes with claims defining the features of the invention that are regarded as novel, it is believed that the invention will be better understood from a consideration of the following description in conjunction with the drawing figures. The theory and application of auto-regulating soldering irons and auto-regulating heaters incorporating magnetic materials is well documented in the literature. Refer to U.S. Pat. Nos.: 4,745,264; 4,659,912; 4,695,712; 4,695,713; 4,717,814; and 4,701,586, each hereby incorporated by reference. These soldering irons and heating devices, when activated, reach but do not exceed their pre-designed maximum operating temperatures. These auto-regulated heat sources are used as heat sources to solder and unsolder components to circuitry by direct physical contact to the component to be soldered (or unsoldered).

Referring now to FIG. 1, a cross-sectional view of the structure of a self heating, auto-regulating solder particle 100, comprises a central core 102 of highly conductive non-magnetic metal or metal alloy with a melting point greater than that of the melting point of the solder. The metal core 102 is preferably copper, silver, gold, or their alloys, but can also be any non-magnetic metal or metal alloy, including low melting solders. Suitable materials are those selected from Groups IVb, Vb, VIb, VIIb, VIII, Ib, IIb, IIIa, IVa and Va of the Periodic Table of the Elements. This core is coated, either completely or partially, with a layer 105, of a magnetic material having a magnetic permeability greater than 1.0, and having an effective Curie temperature greater than the melting point of the solder. The term "effective Curie temperature" is the temperature at which a material becomes, for purposes of this invention, essentially nonmagnetic. Such temperature may be as little as 1 degree C. or as much as 100 degrees C. less than absolute Curie temperature depending upon the material employed. When the magnetic material approaches the effective Curie temperature, the heat generated in the magnetic material is reduced as a relatively linear function of the resistance of the material. More specifically, an external field is applied via an induction coil fed with a constant alternating current to maintain uniform response to the energy output. The more uniform the current the better the temperature regulation. Various factors govern the amount of inductive heating that can occur; namely, the magnetic properties of the material itself, such as its magnetic permeability as well as its magnetic path length and shape; the field strength available to induce eddy current flow in the material; and the electrical resistance of the material (to usually circular eddy current flow therein). Materials of higher resistance will generate more inductive heat from a given level of eddy current flow than materials having lower resistance; however, larger eddy current flow can be established in such lower resistance materials for a given field strength. The magnetic permeability of ferromagnetic materials is relatively high, such as several thousand, which, in turn, permits these materials to exhibit increased self-inductive heating over paramagnetic or diamagnetic materials, i.e., materials that respectively have a magnetic permeability slightly larger than or less than one. However, as a ferromagnetic material is heated above its "Curie temperature", i.e. the temperature at which that material becomes paramagnetic and its permeability decreases to slightly above one, its induced field strength decreases as does the self-inductive heating generated therein. Furthermore, as the frequency of the external magnetic field increases, the amount of self-inductive heat that will be generated in the material also increases.

As noted above, the material used to form the magnetic layer can be any of the well known conductive ferrous or non-ferrous materials which can undergo self-resistive heating and in which a suitable amount of eddy currents can be induced, with the specific material being selected based on the anticipated current level, the maximum soldering temperature and the expected time at that temperature. Examples of some suitable materials for the magnetic layer are type 304 austenitic stainless steel, INCONEL type 718, and alloy or RENE type 95 nickel-based alloys (INCONEL and RENE are trademarks of International Nickel Company and General Electric Company, respectively). Hereinafter the term "ferromagnetic" is assumed to encompass all such types of materials.

In the preferred embodiment, the Curie temperature of the magnetic layer is also less than the melting point of the central core 102, but may also be the same as or slightly less than that. For example, in one version of the invention, the central core 102 is the same material as the magnetic layer 105, thus the entire central core is a single material. This configuration will require that the magnetic material has a somewhat higher magnetic permeability that in the layered version. In the preferred embodiment, the ferromagnetic materials used are spinel ferrites whose Curie temperatures range between 50 degrees C. to 700 degrees C. Ferrites are generally the materials of choice for all of the various embodiments of the invention since such materials are characterized by a Curie temperature limit. However, any magnetic material having a Curie temperature that determines the maximum temperature that the materials may be heated to by microwave radiation or other electric fields is within the scope of the invention. By contrast, while many other types of metallic materials may be heated by microwave radiation, such materials are not characterized as having a Curie temperature. Hence they can continue to heat up without limit when exposed to microwave or other inductive radiation. The microwave radiation may have a frequency between 400 MHz and 3,000 MHz. When microwaves in the upper section of the frequency range are used, the system operator can deliberately and remotely apply microwave energy to a particular location where it is desired to heat the soldering composition.

The magnetic layer is then overcoated with a solder layer 108, preferably an eutectic tin/lead composition of 63% tin and 37% lead. Other well-known solder alloys can of course be used as the solder layer 108, such as solders made from combinations of In, Pb, Sn, Bi, Sb, Au or Ag. Several methods can be used to provide the various coating layers on the central core 102. For example, Takashashi, in U.S. Pat. No. 4,097,266 discloses a process for making coatings as thin as 20 microns on spheres of silver as small as 0.25 mm. Alternatively, one may coat the spheres using vacuum metal deposition technologies such as sputtering or evaporation. The uncoated spherical particles are placed one layer deep, on a flat carrier pan, and placed into the vacuum deposition chamber. To completely coat all sides of the particles, they should be rolled back and forth during the metal coating cycle. If the particles need only partial coatings, the rolling step is not carried out, and then only the top side of the particles is coated. Solder coatings can also be effected by either electroless plating or electroplating the core material.

Figure 2:
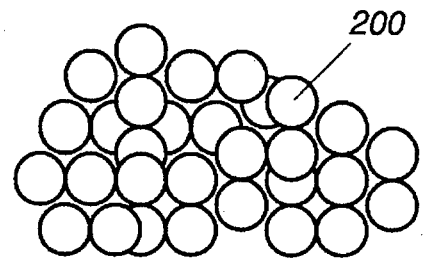
FIG. 2 is a rendering of a prior art solder paste, containing solder particles of only one type.
Figure 3:
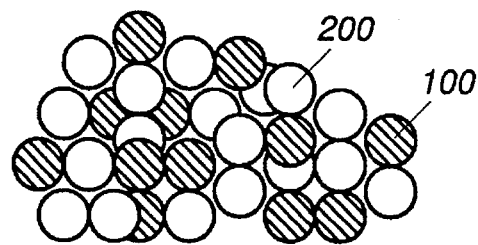
FIG. 3 is a cross-sectional view of a solder paste of the present invention, showing a distribution of both conventional solder particles and a self-heating, auto-regulating solder composition.

Having now made a soldering composition that is auto-regulating, these coated spheres can be mixed with a flux and/or a vehicle to form a self-melting, auto-regulating solder paste. Prior art solder pastes, shown in FIG. 2, only contain particles 200 of conventional solder alloys. These particles 200 are generally a single alloy, and do not contain any materials that are auto-regulating. In a solder paste formulated using the soldering composition of the instant invention (FIG. 3), the particles 100 have an interior layer of a magnetic material, covered by a layer of a solder alloy. The solder paste can have all the particles composed of the layered variety, or additional particles 200 of solid solder can be mixed in and added to the solder paste if desired. These additional particles are composed of conventional solder alloys, and are well known to those skilled in the art. Specific formulations and techniques for making a solder paste using solder particles, fluxes and vehicles are well documented in the literature, and the reader unskilled in the art is advised to consult these documents. The formulated solder paste is then applied to a printed wiring board using the conventional methods of screen printing, stencil printing, or direct syringe dispensing. Components are placed into the paste, and the paste is either fused with conventional thermal means, or preferably, by inductive coupling to the fields of a high frequency alternating electromagnetic field. The alternating field of constant amplitude and frequency will couple with the magnetic layer in the solder particles, causing the magnetic layer to heat up. This heat is quickly transferred to the solder layer, which melts and fuses the solder paste, forming an interconnect between the component and the board. The heating will continue until the electromagnetic source is removed or until the Curie temperature of the magnetic layer is reached, at which time the magnetic layer converts to a non-magnetic state. When this occurs, the self-heating stops, thus regulating the temperature of the solder paste. When the solder pasted contains conventional solder particles, the heat generated by the inductively heated layered particles is also transferred to the conventional solder particles, thus melting them.

A self-melting auto-regulating soldering composition employing Curie point regulation relies on the fact that as a result of skin effect, current is concentrated in the skin of a conductor. In the solder particles of the instant invention, a coating or layer of high impedance, high mu material is applied to a good current conductor. Below the Curie temperature the majority of the current is confined to 2.5 to 3.5 skin depths of the exterior of the conductor. This insures that a large majority of the current is confined to the high resistance material, insuring rapid heating. When the temperature of the high mu material approaches its effective Curie temperature the permeability of the material approaches one, and since $P=I^2R$ where I is a constant and R is reduced as the current spreads into the low resistance material, the rate of heating of the device is reduced. As a result of the change in permeability, the temperature falls below the effective Curie temperature and the cycle repeats. At some temperature below absolute Curie temperature, from 1 degree C. to 100 degrees C. depending on the material, the rate of heating is reduced sufficiently that temperature of the heater stabilizes below Curie temperature. The high permeability materials may be ferromagnetic, ferrimagnetic or any other material, the magnetic permeability of which decreases with temperature.

Having now described the concept of a self melting, auto-regulating solder composition, the reader can appreciate that a soldering composition has been provided that can be used to significant advantage in situations where conventional solder pastes are ineffective. Since the solder paste is inductively heated by an electromagnetic field, phenomena commonly found in solder reflow such as thermal insulation and blanketing are eliminated. Since only the solder particles themselves are being heated internally, the heat is applied precisely at the point where it is needed to melt the solder. Excess and waste heat is not generated in the component body and other large heat sinks, thus creating a solder reflow process that is extremely energy efficient. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A soldering composition having an auto-regulating temperature, comprising:

a central core of a non-magnetic metal;

a magnetic material coating the central core, the magnetic material having a Curie temperature substantially corresponding to the auto-regulating temperature; and a solder layer overlying the magnetic material, the solder layer having a melting temperature that is lower than the Curie temperature.

2. The soldering composition as described in claim 1, wherein the central core has a melting temperature greater than the Curie temperature.

3. The soldering composition as described in claim 1, wherein the Curie temperature is about 1 degree–100 degrees C. greater than the melting temperature of the solder layer.

4. The soldering composition as described in claim 1, wherein the soldering composition is heated to the melting point of the solder by applying an alternating current field of substantially constant amplitude to the magnetic material sufficient to cause the magnetic material to reach the Curie temperature.

5. The soldering composition as described in claim 1, wherein the central core comprises one or more metals or metal alloys selected from the group consisting of elements from Groups IVb, Vb, VIb, VIIb, VIII, Ib, IIb, IIIa, IVa and Va.

6. The soldering composition as described in claim 1, wherein the magnetic material comprises one or more metal alloys selected from the group consisting of type 304 austenitic stainless steel, INCONEL® type 718, and alloy type 95.

7. The soldering composition as described in claim 1, wherein the magnetic material is a ferromagnetic material.

8. The soldering composition as described in claim 1, wherein the solder layer comprises one or more metals or metal alloys selected from the group consisting of In, Pb, Sn, Bi, Sb, Au and Ag.

9. The soldering composition as described in claim 1, wherein the magnetic material is electrically conductive.

10. The soldering composition as described in claim 1, wherein the soldering composition comprises solder particles.

11. The soldering composition as described in claim 10, further comprising a vehicle and a solder flux blended with the solder particles.

12. A soldering composition, comprising:

a vehicle and a flux; and first solder particles comprising:

a central core of a non-magnetic metal;

a magnetic material coating the central core, the magnetic material having a Curie temperature substantially corresponding to the auto-regulating temperature; and a solder layer overlying the magnetic material, the solder layer having a melting temperature that is lower than the Curie temperature.

13. The soldering composition as described in claim 12, further comprising second solder particles comprising an alloy of tin and lead.

14. The soldering composition as described in claim 12, wherein the application of an alternating current field of substantially constant amplitude to the magnetic material causes the magnetic material to heat until it reaches the Curie temperature, thereby melting the solder layer.

15. The soldering composition as described in claim 14, wherein the continued application of the alternating current field does not further heat the magnetic layer.

* * * * *